(12) United States Patent
Cai et al.

(10) Patent No.: US 10,665,631 B1
(45) Date of Patent: May 26, 2020

(54) DISPLAY PANEL AND DISPLAY DEVICE

(71) Applicant: XIAMEN TIANMA MICRO-ELECTRONICS CO., LTD., Xiamen (CN)

(72) Inventors: Xuanxian Cai, Xiamen (CN); Bozhi Liu, Xiamen (CN); Guozhao Chen, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/391,991

(22) Filed: Apr. 23, 2019

(30) Foreign Application Priority Data

Dec. 27, 2018 (CN) .......................... 2018 1 1611523

(51) Int. Cl.
*H01L 27/146* (2006.01)
*G06K 9/00* (2006.01)
*H01L 51/42* (2006.01)

(52) U.S. Cl.
CPC ...... *H01L 27/14678* (2013.01); *G06K 9/0004* (2013.01); *H01L 27/14621* (2013.01); *H01L 27/14623* (2013.01); *H01L 27/14625* (2013.01); *H01L 27/14627* (2013.01); *H01L 51/42* (2013.01)

(58) Field of Classification Search
None
See application file for complete search history.

(56) References Cited

U.S. PATENT DOCUMENTS

2017/0110502 A1* 4/2017 Watanabe ............... H01L 31/18

FOREIGN PATENT DOCUMENTS

CN 207148485 U 3/2018

* cited by examiner

*Primary Examiner* — Cheung Lee
(74) *Attorney, Agent, or Firm* — Anova Law Group PLLC

(57) ABSTRACT

A display panel includes an array substrate and a color film substrate. The array substrate includes a plurality of light-sensing elements. The color film substrate includes a first substrate, a first light-shielding layer, and at least one second light-shielding layer. The first light-shielding layer is located on a side of the first substrate adjacent to the array substrate, and includes a plurality of first hollowed regions. The at least one second light-shielding layer is located on a side of the first light-shielding layer adjacent to the array substrate, and includes a plurality of second hollowed regions. In a direction perpendicular to the first substrate, orthogonal projections of the plurality of first hollowed regions, the plurality of second hollowed regions, and the plurality of light-sensing elements overlap with each other. A first flat layer is disposed between the first light-shielding layer and the at least one second light-shielding layer.

20 Claims, 11 Drawing Sheets

DISPLAY PANEL AND DISPLAY DEVICE

CROSS-REFERENCES TO RELATED APPLICATIONS

This application claims the priority of Chinese patent application No. 201811611523.4, filed on Dec. 27, 2018, the entirety of which is incorporated herein by reference.

FIELD OF THE DISCLOSURE

The present disclosure generally relates to the field of display technology and, more particularly, relates to a display panel and a display device.

BACKGROUND

With the popularization of mobile display products, information security became to receive more attention. Because fingerprints demonstrate advantages such as uniqueness, difficulty in copying, security, etc., in recent years, fingerprint recognition technology has been widely used in mobile display products as a method for identity authentication and access control, which significantly improves the security and the operability of mobile display products.

Fingerprint recognition is mainly divided into three types: capacitive fingerprint recognition, ultrasonic fingerprint recognition, and optical fingerprint recognition. Capacitive fingerprint recognition uses a fingerprint sensing electrode, together with a conductive subcutaneous electrolyte, to generate an electric field. The ups and downs of a fingerprint (i.e., the ridges and valleys of a fingerprint) may lead to different changes in the voltage difference between the two electrodes, which can be used to realize fingerprint determination. Despite of the demonstrated strong adaptability, this fingerprint recognition method is difficult to meet the full-screen development trend of display products. Ultrasonic fingerprint recognition exploits the difference in the reflections of ultrasonic waves due to the difference in fingerprints to establish three-dimensional (3D) fingerprint images; however, the current technology is not mature yet. Optical fingerprint recognition exploits the principle of light refraction and reflection. For example, when a finger is pressed on an optical lens, due to the difference in the reflection of light from the valleys and the ridges on the surface of the finger, the difference between different fingerprints information received by the sensing device can be realized, and a fingerprint image may be formed. Therefore, the operating principle of optical fingerprint recognition is not only relatively simple, but also suitable for full-screen design of display products. However, it is difficult to improve the accuracy of fingerprint recognition because the sensing device used in the fingerprint recognition process can be easily affected by optical noise.

According to all the aspects described above, for optical fingerprint recognition, there are relatively few technical difficulties that need to be overcome in order to achieve full screen display products; however, how to improve the accuracy of fingerprint recognition is still an urgent problem to be solved in the field. The disclosed display panel and display device are directed to solve one or more problems set forth above and other problems in the art.

BRIEF SUMMARY OF THE DISCLOSURE

One aspect of the present disclosure provides a display panel. The display panel includes an array substrate, and a color film substrate disposed opposite to the array substrate. The array substrate includes a plurality of light-sensing elements. The color film substrate includes a first substrate, a first light-shielding layer, and at least one second light-shielding layer. The first light-shielding layer is located on a side of the first substrate adjacent to the array substrate, and includes a plurality of first hollowed regions. The at least one second light-shielding layer is located on a side of the first light-shielding layer adjacent to the array substrate, and includes a plurality of second hollowed regions. In a direction perpendicular to a plane of the first substrate, orthogonal projections of a first hollowed region of the plurality of first hollowed regions, a second first hollowed region of the plurality of second hollowed regions, and a light-sensing element of the plurality of light-sensing elements overlap with each other. A first flat layer is disposed between the first light-shielding layer and the at least one second light-shielding layer.

Another aspect of the present disclosure provides a display device. The display device includes a display panel. The display panel includes an array substrate, and a color film substrate disposed opposite to the array substrate. The array substrate includes a plurality of light-sensing elements. The color film substrate includes a first substrate, a first light-shielding layer, and at least one second light-shielding layer. The first light-shielding layer is located on a side of the first substrate adjacent to the array substrate, and includes a plurality of first hollowed regions. The at least one second light-shielding layer is located on a side of the first light-shielding layer adjacent to the array substrate, and includes a plurality of second hollowed regions. In a direction perpendicular to a plane of the first substrate, orthogonal projections of a first hollowed region of the plurality of first hollowed regions, a second first hollowed region of the plurality of second hollowed regions, and a light-sensing element of the plurality of light-sensing elements overlap with each other. A first flat layer is disposed between the first light-shielding layer and the at least one second light-shielding layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Various exemplary embodiments of the present disclosure will now be described in detail with reference to the accompanying drawings. It should be noted that the relative arrangement of the components and steps, numerical expressions and numerical values set forth in the embodiments are not intended to limit the scope of the present disclosure. The following description of the at least one exemplary embodiment is merely illustrative, and by no means can be considered as limitations for the application or use of the present disclosure.

It should be noted that techniques, methods, and apparatuses known to those of ordinary skill in the relevant art may not be discussed in detail, but where appropriate, the techniques, methods, and apparatuses should be considered as part of the specification.

In all of the examples shown and discussed herein, any specific values should be considered as illustrative only and not as a limitation. Therefore, other examples of exemplary embodiments may have different values.

It should be noted that similar reference numbers and letters indicate similar items in subsequent figures, and therefore, once an item is defined in a figure, it is not required to be further discussed or defined in the subsequent figures.

Figure 1:
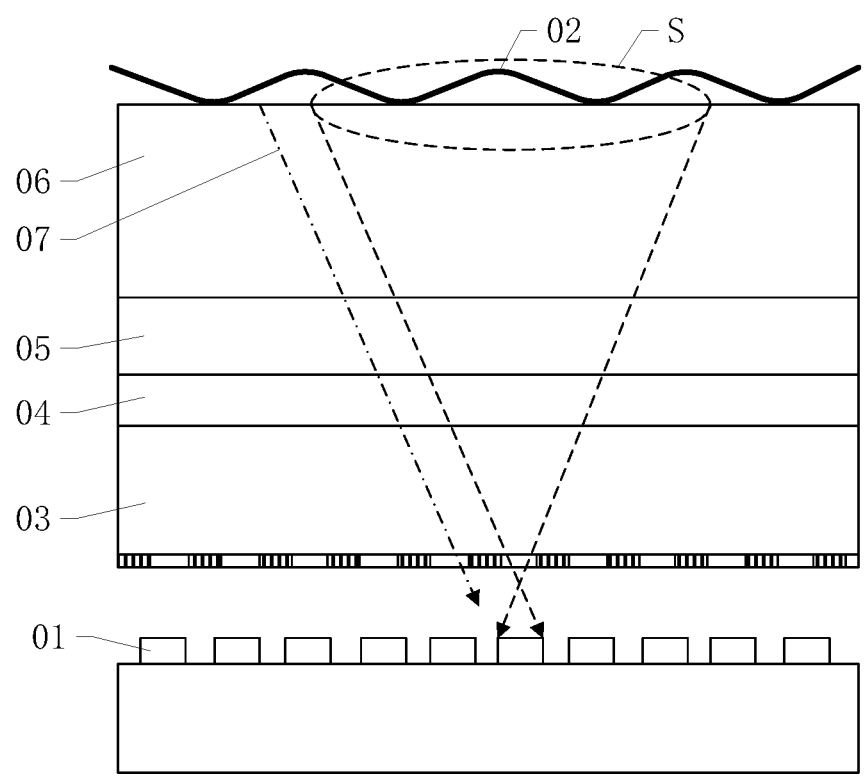
FIG. 1 illustrates a schematic cross-sectional view of a display panel.

FIG. 1 illustrates a schematic cross-sectional view of a display panel. Referring to FIG. 1, in the display panel, because of structures such as a color film glass 03, a polarizer 04, an optical glue layer 05, a cover plate 06, etc. disposed between a sensing device 01 and a fingerprint 02, the distance between the sensing device 01 and the fingerprint 02 becomes too large, thereby causing the following problems in the fingerprint information received by an adjacent sensing device 01:

1) In a recognition region S, because the region of the received fingerprint information is too large and covers information of more than one pair of valley and ridge, imaging the fingerprint becomes difficult;

2) For adjacent recognition regions S, the fingerprint information may substantially overlap with each other, thereby reducing the actual recognition accuracy, increasing the difficulty of the imaging algorithm, and even leading to imaging failure;

3) The crosstalk light 07 is reflected to the sensing device 01 through the adjacent light transmitting regions on the color film glass 03, and thus generates optical noise information, thereby interfering with imaging.

Figure 2:
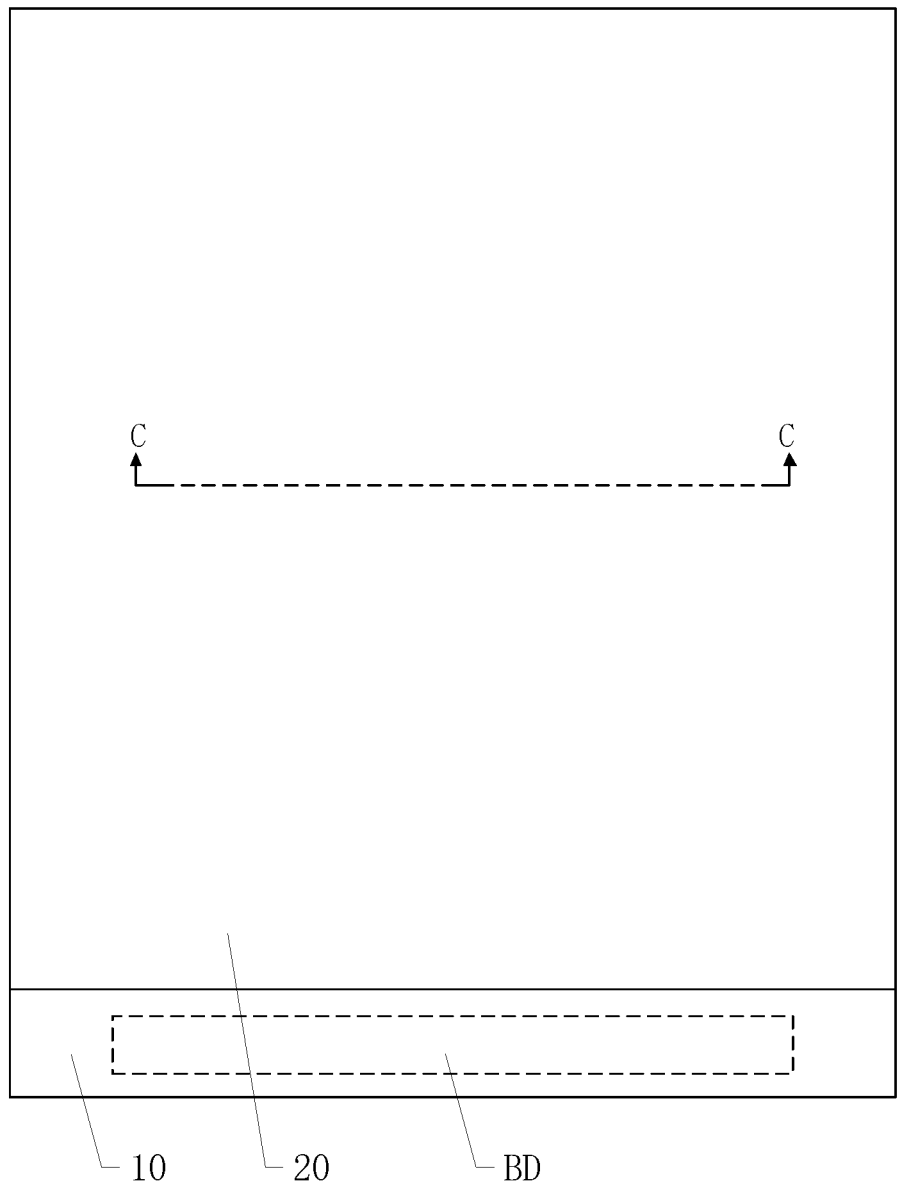
FIG. 2 illustrates a schematic plan view of an exemplary display panel according to some embodiments of the present disclosure.
Figure 3:
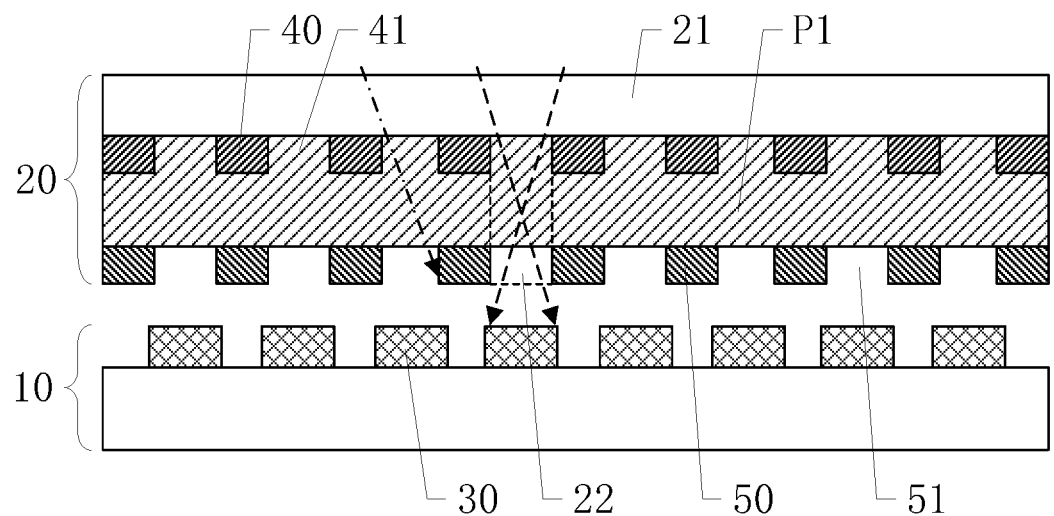
FIG. 3 illustrates a schematic cross-sectional view the display panel shown in FIG. 2 along a C-C direction.

In order to solve the technical problems described above, the present disclosure provides a display panel. FIG. 2 illustrates a schematic plan view of an exemplary display panel according to some embodiments of the present disclosure, and FIG. 3 illustrates a schematic cross-sectional view the display panel shown in FIG. 2 along a C-C direction. Referring to FIGS. 2-3, the display panel may include an array substrate 10 and a color film substrate 20 disposed opposite to the array substrate 10. The array substrate 10 may include a plurality of light-sensing elements 30, and the color film substrate 20 may include a first substrate 21, a first light-shielding layer 40, and at least one second light-shielding layer 50. The first light-shielding layer 40 may be located on the side of the first substrate 21 that is adjacent to the array substrate 10, and the first light-shielding layer 40 may include a plurality of first hollowed regions 41. The at least one second light-shielding layer 50 may be located on the side of the first shielding layer 40 that is adjacent to the array substrate 10, and the at least one second light-shielding layer 50 may include a plurality of second hollowed regions 51. In a direction perpendicular to the plane of the first substrate 21, the orthogonal projections of a first hollowed region 41 of the plurality of first hollowed regions 41, a second hollowed region 51 of the plurality of second hollowed regions 51, and a light-sensing element 30 of the plurality of light-sensing elements 30 may overlap with each other. In addition, a first flat layer P1 may be disposed between the first light-shielding layer 40 and the at least one second light-shielding layer 50.

In the display panel, the array substrate 10 and the color film substrate 20 may be disposed opposite to each other, and the size of the array substrate 10 may be larger than the size of the color film substrate 20, such that a step region BD may be easily formed between the array substrate 10 and the color film substrate 20. The step region BD may be used to bond the integrated circuit (IC) that provides various driving signals for the array substrate 10.

A plurality of light-sensing elements 30 may be disposed on the array substrate 10. Each of the plurality of light-sensing elements 30 may have a light-sensing function, and may convert an optical signal into an electrical signal. For example, a finger has fingerprint valleys and fingerprint ridges, and when the finger is pressed on the display panel, each ridge may be in contact with the surface of the display panel, while each valley may not be in contact with the surface of the display panel. At this time, the reflectance when light hits the display panel corresponding to a ridge may be different from the reflectance when light hits a valley. Therefore, when the reflected light is received by the light-sensing elements 30, the intensity of the light reflected by the ridge may be different from the intensity of the light reflected by the valley. In the light-sensing element 30, the photocurrents converted from reflected light with different intensities may have different magnitudes, and therefore, the ridge and the valley of the fingerprint can be identified according to the magnitude of the photocurrent. When the plurality of light-sensing elements 30 work together, the fingerprint information can be recognized.

The first light-shielding layer 40 may be disposed on the side of the first substrate 21 that is adjacent to the array substrate 10, such that the first light-shielding layer 40 can be directly patterned on the first substrate 21, as shown in FIG. 3. Of course, other film layers may be disposed between the first light-shielding layer 40 and the first substrate 21. The first substrate 21 may be made of a hard material such as glass, or may be made of a soft material such as resin. However, the present disclosure is not limited to the above embodiments. The first light-shielding layer 40 may include a plurality of first hollowed regions 41. The portion of the first light-shielding layer 40 other than the plurality of first hollowed regions 41 may be made of a material having a low light transmittance, such that the plurality of first hollowed regions 41 may allow light to pass through, while the portion of the first light-shielding layer 40 other than the plurality of first hollowed regions 41 may block light from passing through.

The at least one second light-shielding layer 50 may be located on the side of the first light-shielding layer 40 that is adjacent to the array substrate 10, and the at least one second light-shielding layer 50 may include a plurality of second hollowed regions 51. The portion of the at least one second light-shielding layer 50 other than the plurality of second hollowed regions 51 may be made of a material having a low light transmittance, such that the plurality of second hollowed regions 51 may allow light to pass through, while the portion of the at least one second light-shielding layer 50 other than the plurality of second hollowed regions 51 may block light from passing through. The material having a low light transmittance for the at least one second light-shielding layer 50 and the material having a low light transmittance for the first light-shielding layer 40 may be the same or may be different. However, the present disclosure is not limited to the above embodiment.

In one embodiment, a first flat layer P1 may be disposed between the first light-shielding layer 40 and the at least one second light-shielding layer 50. The first flat layer P1 may be made of an organic material that is easy to fabricate a thick film layer. In order to allow light to pass through the first flat layer P1, the organic material may also have a high light transmittance. As such, without affecting the light passing through the first flat layer P1, the thickness of the film layer where the first flat layer P1 is located can be large. That is, in a direction perpendicular to the plane of the first substrate 21, the distance between the first light-shielding layer 40 and the at least one second light-shielding layer 50 may be large. Because of the presence of the plurality of first hollowed regions 41, when forming the first flat layer P1, a portion of the organic material may overflow into the plurality of first hollowed regions 41.

In the direction perpendicular to the plane of the first substrate 21, the orthogonal projections of a first hollowed region 41 of the plurality of first hollowed regions 41, a second hollowed region 51 of the plurality of second hollowed regions 51, and a light-sensing element 30 of the plurality of light-sensing elements 30 may overlap with each other. That is, a plurality of straight channels 22 that control the passage of light may be formed between the plurality of first hollowed regions 41 and the plurality of second hollowed regions 51. For a given straight channel 22, after the light reflected by the ridges and valleys of a finger enters the display panel, the light may enter a light-sensing element 30 through the straight channel 22, and then may be converted to a photocurrent for fingerprint recognition. Moreover, due to the interference of the light-shielding layers (i.e. the first light-shielding layer 40 and the at least one second light-shielding layer 50), the reflected light through other straight channels 22 may not be able to enter the light-sensing element 30 that corresponds to the straight channel 22 and further generate optical noise. Therefore, the influence of optical noise on the recognition accuracy of fingerprint information may be effectively prevented. At the same time, because the plurality of straight channels 22 have a desired constraining effect on the reflected light, the overlapping portion between the fingerprint information recognition regions on the surface of the display panel may be effectively reduced or even eliminated, which may facilitate the implementation of fingerprint imaging, thereby improving the recognition accuracy of fingerprint information.

Because the first flat layer P1 is located between the first light-shielding layer 40 and the at least one second light-shielding layer 50, the plurality of straight channels 22 may penetrate through the first flat layer P1. Therefore, in the direction perpendicular to the first substrate 21, the height of the plurality of straight channels 22 can be defined by controlling the thickness of the first flat layer P1. As such, the formation process of the plurality of straight channels 22 may be simple and convenient. In addition, the larger the height of the plurality of straight channels 22 is, the smaller the size of the fingerprint information recognition region is, which may be more favorable for improving the recognition accuracy of fingerprint information. Of course, improving the recognition accuracy by increasing the height of the straight channel 22 is not an absolute solution, and the height of the straight channel 22 should be adjusted within a reasonable range.

Without changing the structure of the light-shielding layers, the size of the fingerprint information recognition region can be flexibly adjusted by appropriately controlling the thickness of the first flat layer P1, and the mask plates for patterning the hollowed regions may not need to be changed. In addition, by controlling the number of the at least one second light-shielding layer 50, the size of the fingerprint information recognition region can also be flexibly adjusted, and the mask plates for patterning the hollowed regions may not need to be changed, which is conducive to reducing the cost and difficulty of the manufacturing process.

It should be noted that, in order to more intuitively illustrate the technical schemes of the present disclosure, other film layer structures are not illustrated in FIGS. 2 and 3. In addition, on the side of the color film substrate 20, the plurality of first hollowed regions 41 and the plurality of second hollowed regions 51 may have various shapes, such as circles, squares, etc. in the direction parallel to the plane of the first substrate 21. Moreover, on the side of the array substrate 10, other film layers may be disposed on the side of the plurality of light-sensing elements 30 adjacent to the color film substrate 20. However, the present disclosure is not limited to the above embodiments. For example, in some other embodiments, other film layers may be disposed on the side of the plurality of light-sensing elements 30 away from the color film substrate 20.

Figure 4:
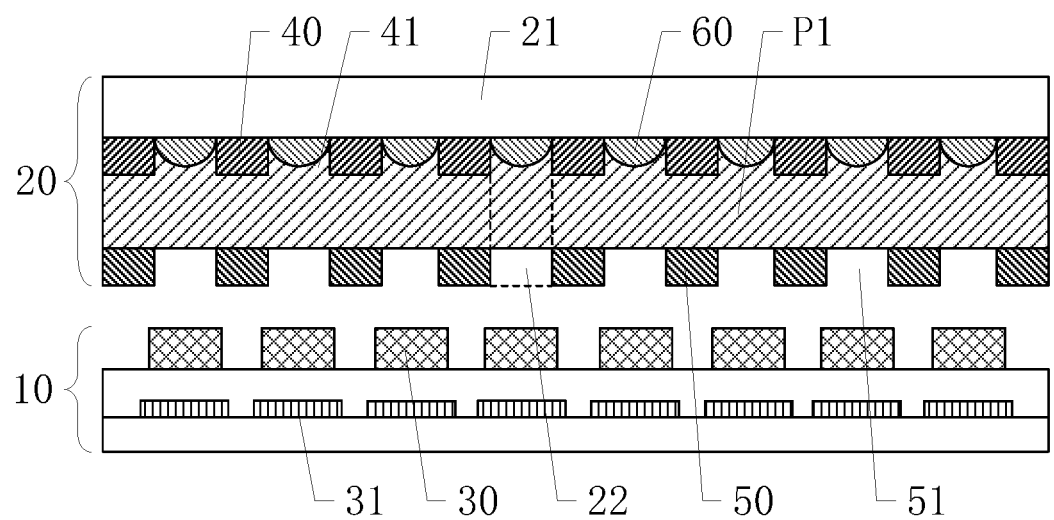
FIG. 4 illustrates another schematic cross-sectional view the display panel shown in FIG. 2 along the C-C direction.

Referring to FIG. 2 and FIG. 4, in some embodiments, the display panel may further include a plurality of first lenses 60. The plurality of first lenses 60 may be located in the plurality of first hollowed regions 41 and/or the plurality of second hollowed regions 51. Moreover, the curved surface of each first lens 60 may be arranged to face toward the array substrate 10.

For a display panel that cannot emit light by itself, such as a liquid crystal display (LCD) panel, the light source is usually provided by a backlight, and in order to prevent the light of the backlight from being reflected by the ridges and valleys of the finger, it is required to dispose a light-shielding part 31 on the plurality of light-sensing elements 30 away from the color film substrate 20. In one embodiment, the curved surface of each first lens 60 may be arranged to face toward the array substrate 10, that is, the first lens 60 may have a convergence effect on the light. When the light reflected by the ridges and valleys of the finger is incident on the first lens 60, the reflected light can converge into the plurality of light-sensing elements 30 through the plurality of straight channels 22. Therefore, the size of the light-sensing elements 30 can be made smaller, and correspondingly, the size of the light-shielding part 31 can also be reduced, which may be conducive to increasing the aperture ratio of the film layer where the light-shielding part 31 is located, and improving the utilization efficiency of the backlight.

Figure 5:
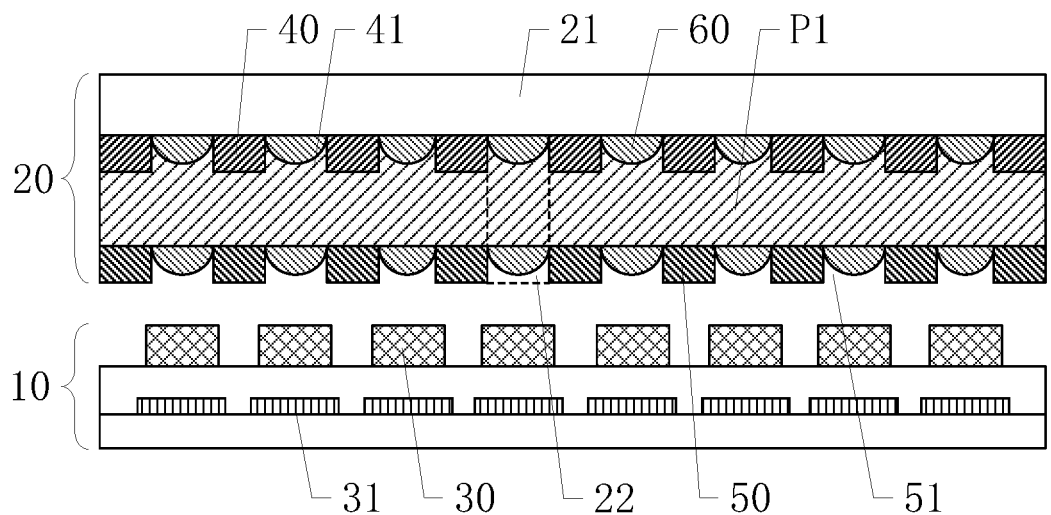
FIG. 5 illustrates another schematic cross-sectional view the display panel shown in FIG. 2 along the C-C direction.

In order to allow the light reflected by the ridges and valleys of the finger to pass through the plurality of first lenses 60, the plurality of first lenses 60 may be made of a material having a high light transmittance. In addition, the material for the plurality of first lenses 60 may also have a refractive index larger than the refractive index of the material of the adjacent film layers to reduce the loss of reflected light during transmission in the plurality of straight channels 22. The plurality of first lenses 60 may be disposed only in the plurality of first hollowed regions 41, as shown in FIG. 4. However, the present disclosure does not specifically require the plurality of first lenses 60 to be disposed only in the plurality of first hollowed regions 41. In other embodiment, the plurality of first lenses 60 may be disposed only in the plurality of second hollowed regions 51, or the plurality of first lenses 60 may be disposed in both the plurality of first hollowed regions 41 and the plurality of second hollowed regions 51 to increase the convergence effect on the reflected light, as shown in FIG. 5. In addition, in FIG. 5, the first lenses 60 located in the plurality of first hollowed regions 41 and the first lenses 60 located in the plurality of second hollowed regions 51 may be identical in size, shape, material, etc., or may be partially different or completely different. However, the present disclosure is not limited to the above embodiments.

Figure 6:
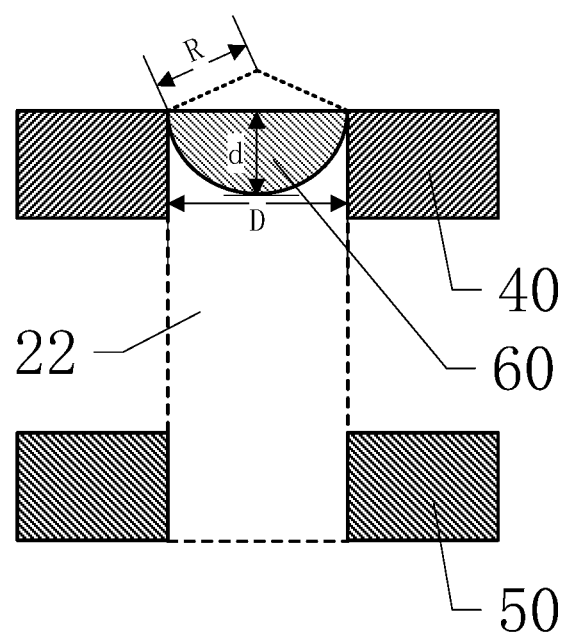
FIG. 6 illustrates a schematic enlarged view of a straight channel and a first lens shown in FIG. 4.

In one embodiment, referring to FIG. 4 and FIG. 6, the cross section of each first hollowed region 41 may have a circular shape in a direction parallel to the plane of the first substrate 21. In addition, the curvature radius of the curved surface of each first lens 60, e.g., R, may satisfy $R \geq (4d^2 + D^2)/(8d)$, where d is the maximum thickness of the first lens 60, and D is the diameter of the first hollowed region 41.

For example, the shape of the cross section of the first hollowed region 41 may be circular in a direction parallel to the plane of the first substrate 21, and accordingly, the shape of the first lens 60 may be hemispherical with R=d, or may be approximately hemispherical with the curvature radius of the curved surface of the first lens 60 greater than or equal to $(4d^2+D^2)/(8d)$, e.g., $R \geq (4d^2+D^2)/(8d)$. Due to the manufacturing process and the actual needs, the maximum thickness d of the first lens 60 generally satisfies $d \geq 1$ μm. Because the thickness of the first light-shielding layer 40 is usually larger than 1 μm, in one embodiment, the maximum thickness d of the first lens 60 may be set to be equal to or smaller than the thickness of the first light-shielding layer 40 according to actual conditions. However, the present disclosure is not limited to the above embodiment, and in some other embodiments, the maximum thickness d of the first lens 60 may be set to be larger than or equal to the thickness of the first light-shielding layer 40.

Figure 7:
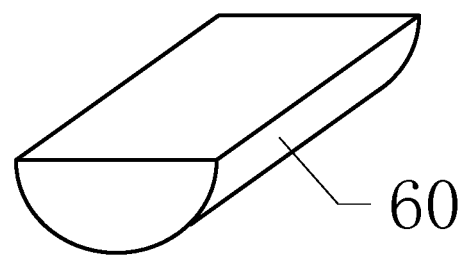
FIG. 7 illustrates a schematic three-dimensional structural view of the first lens shown in FIG. 4.

In one embodiment, referring to FIG. 4 and FIG. 7, the shape of the first lens 60 may also be semi-cylindrical or approximately semi-cylindrical, and accordingly, in the direction parallel to the plane of the first substrate 21, each hollowed region 41 may have a rectangular cross section.

Because the curved surface of the first lens 60 is arranged to face toward the array substrate 10, when the light reflected by the ridges and valleys of the finger enters the first lens 60, the reflected light may still be converged and incident into the light-sensing element 30 through the straight channel 22.

Figure 8:
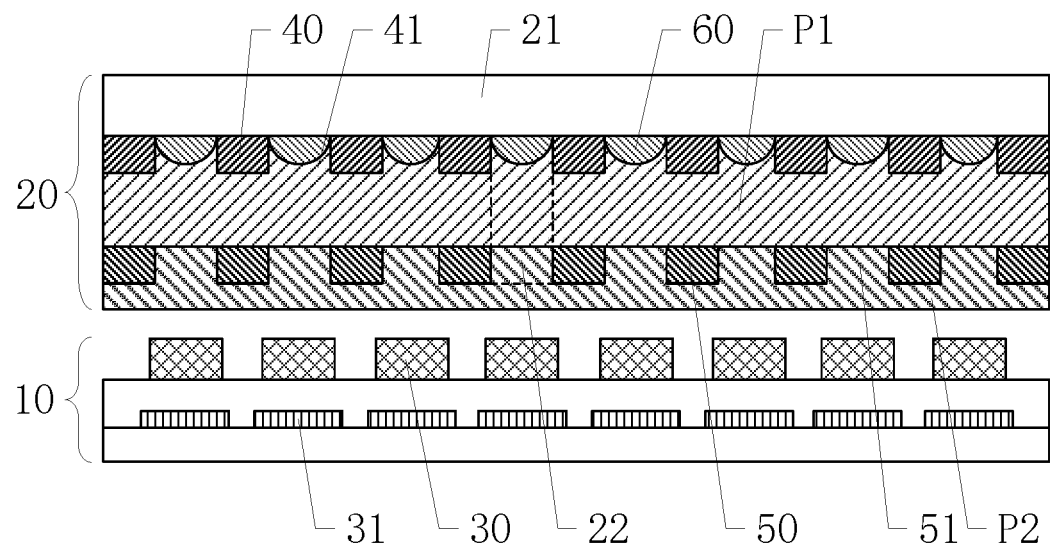
FIG. 8 illustrates another schematic cross-sectional view the display panel shown in FIG. 2 along the C-C direction.

In some embodiments, as shown in FIG. 2 and FIG. 8, a second flat layer P2 may be disposed on the side of the at least one second light-shielding layer 50 adjacent to the array substrate 10.

In one embodiment, the second flat layer P2 may be located on the side of the second-shielding layer 50 that is adjacent to the array substrate 10. In order to allow light to pass through the second flat layer P2, the second flat layer P2 may also need to have a high light transmittance. Therefore, the second flat layer P2 and the first flat layer P1 may be made of a same organic material. However, the present disclosure is not limited to the above embodiment. For example, in other embodiments, without affecting the transmission of light, the second flat layer P2 may be made of a material different from the material of the first flat layer P1.

The second flat layer P2 may have a desired planarization effect, such that the step difference of the film layers of the display panel may be smoothed. Therefore, the surface of the color film substrate 20 that is adjacent to the array substrate 10 may be more flat, which may be conducive to reducing the display difference of the display panel due to the step difference. When forming the second flat layer P2, because of the presence of the second hollowed regions 51, a portion of the organic material of the second flat layer P2 may be able to overflow into the second hollowed regions 51.

Figure 9:
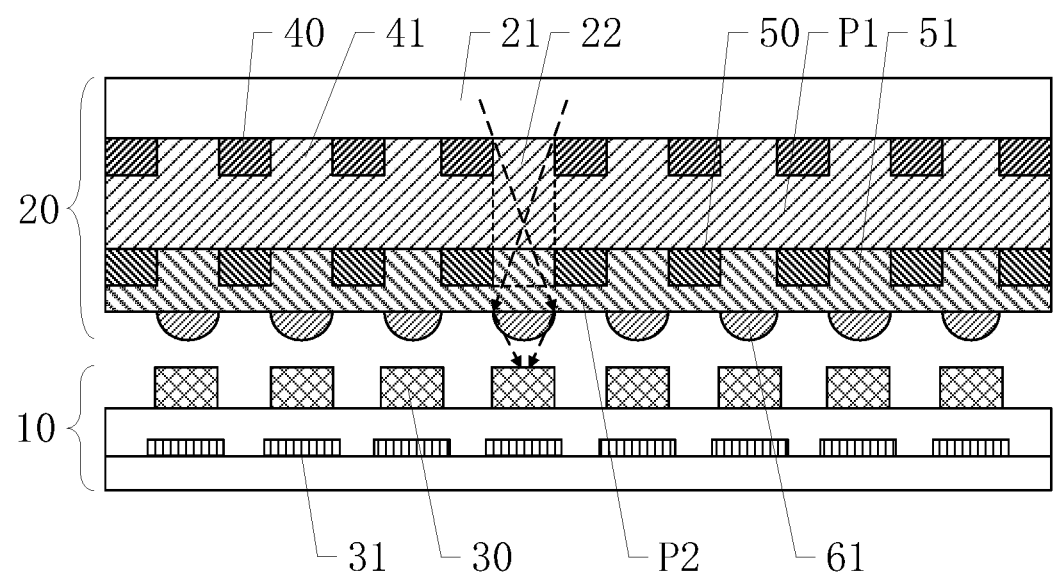
FIG. 9 illustrates another schematic cross-sectional view the display panel shown in FIG. 2 along the C-C direction.

In one embodiment, referring to FIG. 2 and FIG. 9, the display panel may further include a plurality of second lenses 61. The plurality of second lenses 61 may be located on the side of the second flat layer P2 that is adjacent to the array substrate 10, and the curved surface of each second lens 61 may be arranged to face toward the array substrate 10. Moreover, in a direction perpendicular to the plane of the first substrate 21, the orthogonal projections of a second lens 61 of the plurality of second lenses 61, a second hollowed region 51 of the plurality of second hollowed regions 51, and a light-sensing element 30 of the plurality of light-sensing elements 30 may overlap with each other.

In one embodiment, the plurality of second lenses 61 may be located on the side of the second flat layer P2 that is adjacent to the array substrate 10. That is, the plurality of second lenses 61 can be directly patterned on the surface of the second flat layer P2. In order to allow light reflected by the ridges and valleys of the finger to pass through the plurality of second lenses 61, the plurality of second lenses 61 may be made of a material having a high light transmittance.

The desired planarization effect of the second flat layer P2 may be conducive to reduce the difference in the reflected light from different second lenses 61, and thus may further improve the recognition accuracy of fingerprint information. At the same time, in the direction perpendicular to the plane of the first substrate 21, the orthogonal projections of a second lens 61 of the plurality of second lenses 61, a second hollowed region 51 of the plurality of second hollowed regions 51, and a light-sensing element 30 of the plurality of light-sensing elements 30 may overlap with each other. Therefore, when light reflected by the ridges and valleys of a finger enters the plurality of straight channels 22, the reflected light may be converged by the plurality of second lenses 61, and then incident into the plurality of light-sensing elements 30. As such, the sizes of the light-sensing element 30 and the light-shielding part 31 may be further reduced, and the aperture ratio of the film layer where the light-shielding part 31 is located may be increased.

In one embodiment, referring to FIG. 9, the size of the second lens 61 adjacent to the side of the first substrate 21 may be larger than the size of the second hollowed region 51. That is, in a direction perpendicular to the plane of the first substrate 21, the orthogonal projections of the second lens 61 may cover the orthogonal projection of the second hollowed region 51. In this case, the second hollowed region 51 and the second lens 61 may be separated by the second flat layer P2; however, the light transmitted from the straight channel 22 may still be able to converge as desired through the second lens 61, which may be conducive to reducing the loss of the light reflected by the ridges and valleys of the finger, and improving the recognition accuracy of fingerprint information.

Figure 10:
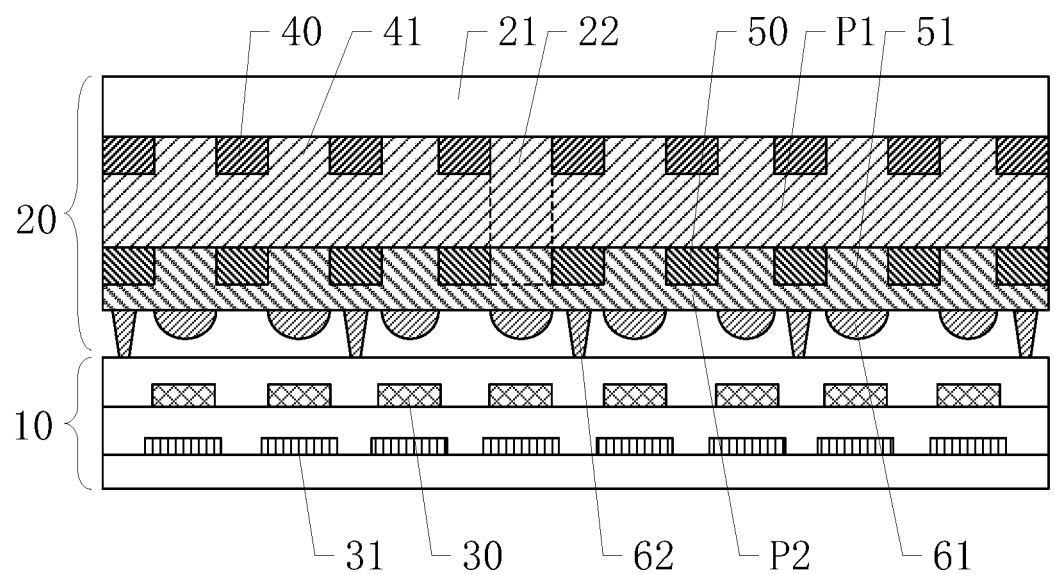
FIG. 10 illustrates another schematic cross-sectional view the display panel shown in FIG. 2 along the C-C direction.

In one embodiment, referring to FIG. 2 and FIG. 10, the display panel may also include a plurality of support pillars 62. The plurality of support pillars 62 may be located between the array substrate 10 and the color film substrate 20, such that the cell thickness between the array substrate 10 and the color film substrate 20 can be maintained through the plurality of support pillars 62, which can effectively prevent the two substrates from collapsing and thus ensure the stability of the display panel during use.

It should be noted that, FIG. 10 merely illustrates the schematic position relationship between the plurality of support pillars 62, the array substrate 10, and the color film substrate 20. Moreover, the shape, the material, and the specific arrangement manner of the plurality of support pillars 62 may vary according to actual requirements of applications, and the present disclosure is not limited to the above embodiments.

In one embodiment, referring to FIG. 10, the plurality of second lenses 61 and the plurality of support pillars 62 may be disposed in a same layer, e.g., a same single layer, and using a same material.

In one embodiment, the plurality of second lenses 61 may be located on the side of the second flat layer P2 that is adjacent to the array substrate. Because the plurality of second lenses 61 and the plurality of support pillars 62 are disposed in a same layer and using a same material, the plurality of second lenses 61 and the plurality of support pillars 62 may be directly patterned on the surface of the second flat layer P2 using a same mask plate. Therefore, using two mask plates to respectively pattern the plurality of second lenses 61 and the plurality of support pillars 62 may not be necessary, which may be conducive to reducing the number of the mask plates and the difficulty of the manufacturing process, thereby improving the production efficiency of the display panel.

In one embodiment, the plurality of second lenses 61 may be made of a material having a relatively high light transmittance. However, in order to ensure that the plurality of support pillars 62 disposed in the same layer has desired buffering performance, the material may also need to have a certain elasticity. For example, the plurality of second lenses 61 may be made of a material such as carbonate resin, flexible polyethylene, etc. In some other embodiments, in order to prevent that the support of the plurality of support pillars 62 to the array substrate 10 and the color film substrate 20 is insufficient due to excessive elasticity, the material may also be a combination of materials with different elastic moduli. In addition, because the thickness of the film layer corresponding to the region of the plurality of second lenses 61 may be different from the thickness of the film layer corresponding to the region of the plurality of support pillars 62, the plurality of second lenses 61 and the plurality of support pillars 62 may be patterned using a halftone mask plate. By controlling the degree of light transmission in different regions on the halftone mask, the degree of film patterning in the corresponding regions can be controlled. However, the present disclosure is not limited to the above embodiment.

Figure 11:
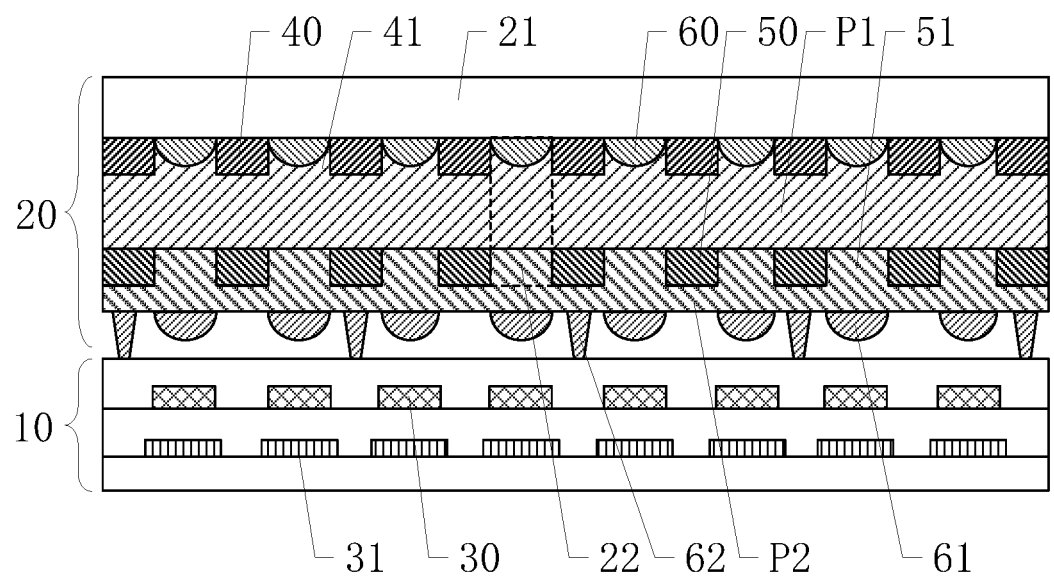
FIG. 11 illustrates another schematic cross-sectional view the display panel shown in FIG. 2 along the C-C direction.

In one embodiment, referring to FIG. 11, the plurality of first lenses 60, the plurality of second lenses 61, and the plurality of support pillars 62 may be made of a same material. Therefore, the plurality of first lenses 60, the plurality of second lenses 61, and the plurality of support pillars 62 may be patterned from a same material.

In one embodiment, the plurality of first lenses 60 may be located in the plurality of first hollowed regions 41, such that the plurality of first lenses 60 can be patterned before forming the first light-shielding layer 40. Because the plurality of second lenses 61 may be located on the side of the second flat layer P2 that is adjacent to the array substrate 10, and may be disposed in a same layer, e.g., a same single layer, and using a same material with the plurality of support pillars 62, the plurality of second lenses 61 and the plurality of support pillars 62 may be directly patterned using a same mask plate after forming the second flat layer P2. As such, it may be conducive to reducing the material costs for fabricating the lenses, which in turn may reduce the production cost of the display device.

In one embodiment, referring to FIG. 11, the maximum thickness of the plurality of second lenses 61 may be smaller than or equal to the height of the plurality of support pillars 62.

In one embodiment, the plurality of second lenses 61 and the plurality of support pillars 62 may be both located on the side of the second flat layer P2 that is adjacent to the array substrate 10. When using the display panel, in order to prevent the light converging effect of the plurality of second lenses 61 from being degraded due to excessive deformation caused by using a finger to press the display panel, the maximum thickness of the plurality of second lenses 61 may be set to be equal to or less than the height of the plurality of support pillars 62. Of course, the heights of the plurality of support pillars 62 may all be the same, or may be partially or completely different. However, the present disclosure is not limited to the above embodiments.

Figure 12:
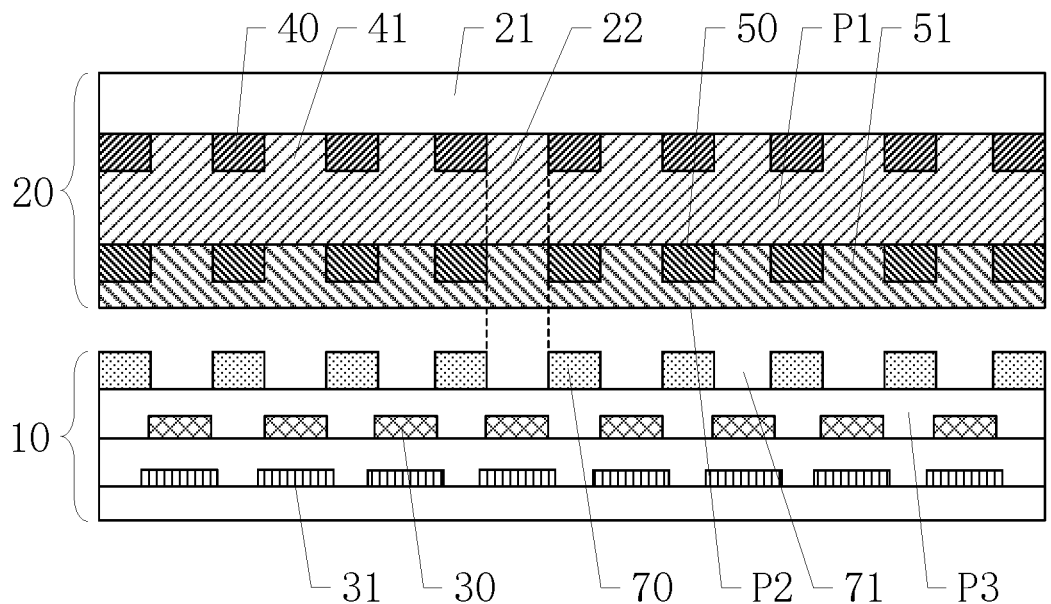
FIG. 12 illustrates another schematic cross-sectional view the display panel shown in FIG. 2 along the C-C direction.

In some embodiments, referring to FIG. 2 and FIG. 12, the array substrate 10 may further include a third light-shielding layer 70 and a third flat layer P3. The third light-shielding layer 70 may be located on the side of the third flat layer P3 that is adjacent to the color film substrate 20, and the third light-shielding layer 70 may include a plurality of third hollowed regions 71. In a direction perpendicular to the plane of the first substrate 21, the orthogonal projection of a third hollowed region 71 of the plurality of third hollowed regions 71 and the orthogonal projection of a light-sensing element 30 of the plurality of light-sensing elements 30 may overlap with each other.

In one embodiment, in a direction perpendicular to the plane of the first substrate 21, the orthogonal projection of a third hollowed region 71 of the plurality of third hollowed regions 71 may overlap with the orthogonal projection of a light-sensing element 30 of the plurality of light-sensing elements 30. Therefore, the plurality of third hollowing regions 71 may also be a part of the plurality of straight channels 22, which may be conducive to further increasing the height of the plurality of straight channels 22 in the direction perpendicular to the plane of the first substrate 21.

As such, the size of the fingerprint information recognition regions on the surface of the display panel may be reduced, and thus the recognition accuracy of fingerprint information may be improved.

In one embodiment, the third light-shielding layer 70 that contains the plurality of third hollowed regions 71 may be located on the side of the third flat layer P3 that is adjacent to the color film substrate 20. The third flat layer P3 may be directly formed on the film layer where the plurality of light-sensing elements 30 is located, or may be separated from the film layer where the plurality of light-sensing elements 30 is located by one or more other film layers. However, the present disclosure is not limited to the above embodiments. FIG. 12 only schematically illustrates a case in which the third flat layer P3 is directly formed on the film layer where the plurality of light-sensing elements 30 is located.

It should be noted that, in a plane parallel to the plane of the first substrate 21, the plurality of third hollowed regions 71 may have various shapes, such as circles, squares, etc. Moreover, the shapes of the plurality of first hollowed regions 41, the plurality of second hollowed regions 51, and the plurality of third hollowed regions 71 may all be the same, or may be partially or completely different. The portion of the third light-shielding layer 70 other than the plurality of third hollowed regions 71 may be made of a material having a low light transmittance, such that the plurality of third hollowed regions 71 may allow light to pass through, while the portion of the third light-shielding layer 70 other than the plurality of third hollowed regions 71 may block light from passing through. The materials having a low light transmittance used for the third light-shielding layer 70 and the at least one second light-shielding layer 50 and the first light-shielding layer 40 may all be the same, or may be partially or completely different. However, the present disclosure is not limited to the above embodiments.

Figure 13:
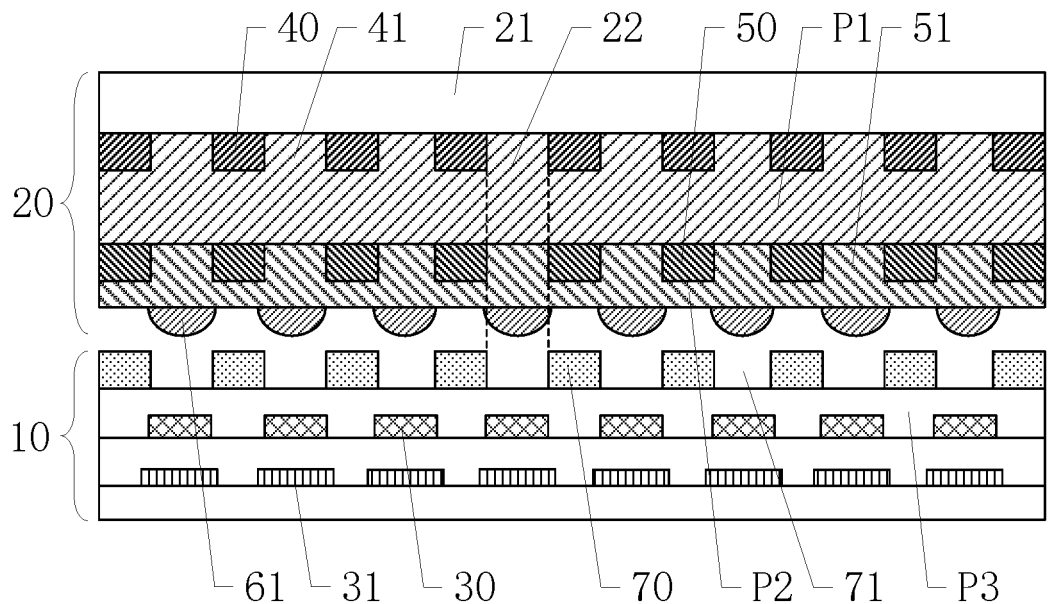
FIG. 13 illustrates another schematic cross-sectional view the display panel shown in FIG. 2 along the C-C direction.

In one embodiment, referring to FIG. 2 and FIG. 13, the plurality of second lenses 61 may be located on the side of the second flat layer P2 that is adjacent to the array substrate 10, and the curved surface of each second lens 61 may be arranged to face toward the array substrate 10. In a direction perpendicular to the plane of the first substrate 21, the orthogonal projection of a second lens 61 of the plurality of second lenses 61 and the orthogonal projection of a third lens 71 of the plurality of third lenses 71 may overlap with each other.

When light reflected by the ridges and valleys of a finger enters a straight channel 22, the reflected light may be converged by a corresponding second lens 61, and then incident into a light-sensing element 30 corresponding to the straight channel 22. As such, due to the interference of the third light-shielding layer 70, the reflected light that is unable to enter the straight channel 22 may not be able to enter the corresponding light-sensing element 30 and further generate optical noise. Therefore, the influence of optical noise on the recognition accuracy of fingerprint information may be further prevented.

Figure 14:
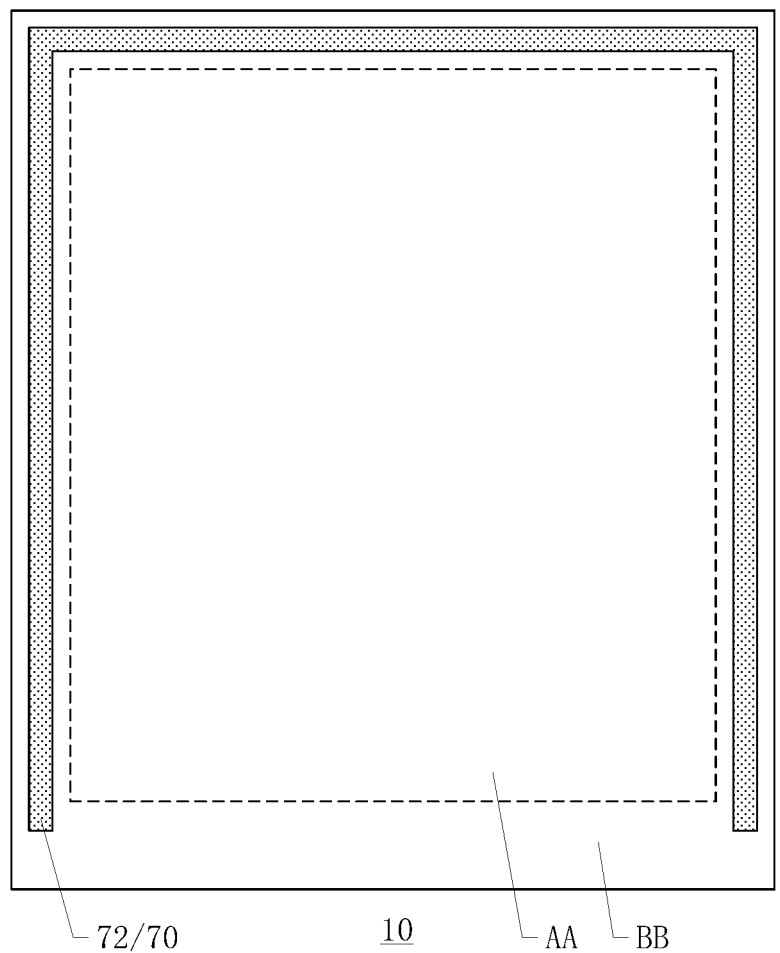
FIG. 14 illustrates a schematic plan view of an exemplary array substrate according to some embodiments of the present disclosure.

In one embodiment, referring to FIG. 13 and FIG. 14, the array substrate 10 may include a display region AA and non-display region BB. The non-display region BB may be disposed to surround the display region AA. The third light-shielding layer 70 may further include at least one ground line 72, and the at least one ground line 72 may be located in the non-display region BB.

In one embodiment, a plurality of pixels for displaying pictures may be disposed in the display region AA of the array substrate 10, and a plurality of lines for providing driving signals to the plurality of pixels may be usually disposed in the non-display region BB of the array substrate 10. In order to prevent these lines from generating electrostatic charges in the display panel and affecting the normal display on the screen, grounding is usually required.

Referring to FIG. 14, in one embodiment, the third light-shielding layer 70 may also include at least one ground line 72 in the non-display region BB. That is, the at least one ground line 72 may be patterned together with the plurality of third hollowed regions 71. Forming the at least one ground line 72 through the third light-shielding layer 70 may be conducive to saving the manufacturing process for the ground line in the display panel, thereby improving the production efficiency.

Because the ground line 72 is usually made of a metal, the third light-shielding layer 70 may also be made of a same material as the metal film layer in the array substrate 10, or may be directly patterned together with a metal film layer. The ground line 72 may have various shapes, such as a U shape shown in FIG. 14. However, the present disclosure is not limited to the above embodiments.

Figure 15:
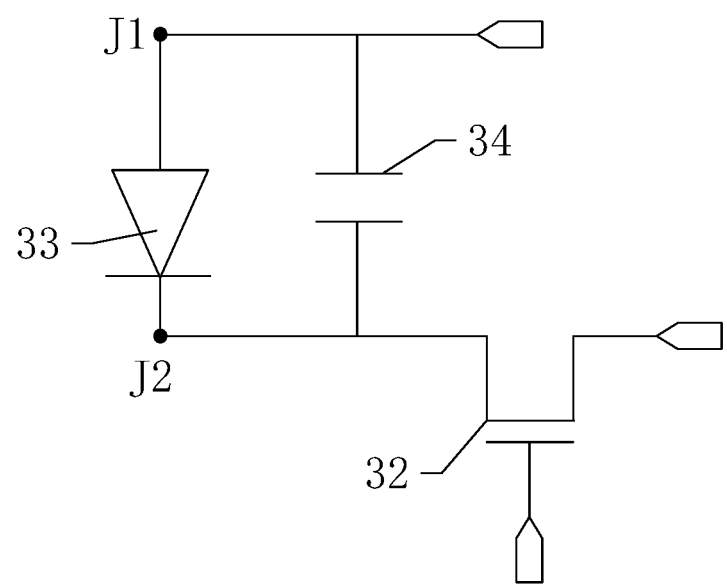
FIG. 15 illustrates a schematic diagram of circuit connection of a light-sensing element according to some embodiments of the present disclosure.
Figure 16:
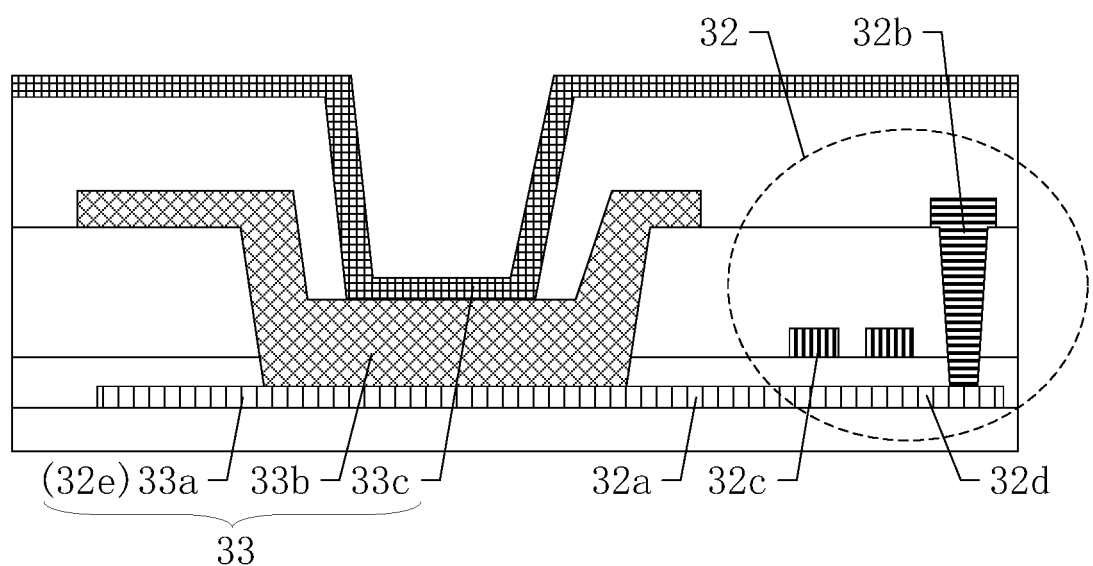
FIG. 16 illustrates a schematic view of a film-layer structure of the light-sensing element shown in FIG. 15.

In some embodiments, referring to FIG. 15 and FIG. 16, each light-sensing element 30 may include a light-sensing switch 32 and a photodiode 33. A first electrode 32a of the light-sensing switch 32 may be electrically connected to the photodiode 33.

In one embodiment, the photodiode 33 may have photosensitive characteristics and have unidirectional conductivity. Without light irradiation, the photodiode 33 may have a small saturated reverse leakage current, that is, a dark current, and accordingly, the photodiode 33 may be turned off. When exposed to light irradiation, the saturated reverse leakage current of the photodiode 33 may be greatly increased and generate a current. Moreover, the current may change as the intensity of the incident light changes.

The first electrode 32a of the light-sensing switch 32 may be electrically connected to the photodiode 33, and when a signal is input to the gate electrode 32c of the light-sensing switch 32 to turn on the light-sensing switch 32, the voltage signal on the second electrode 32b of the light-sensing switch 32 may be transmitted to the first electrode 32a, and through the first electrode 32a, the voltage signal may be transmitted to the photodiode 33. Therefore, fingerprint recognition may be performed by controlling whether the light-sensing switch 32 is turned on or not.

It should be noted that, in order to more intuitively illustrate the technical schemes of the present disclosure, other film layer structures are not illustrated in FIG. 16.

In one embodiment, referring to FIG. 15, the light-sensing element 30 may also include a capacitor 34. The capacitor 34 and the photodiode may be connected in parallel, such that the capacitor 34 may form a storage capacitor for implementing the fingerprint recognition function.

In one embodiment, the fingerprint recognition stage may include a preparation stage, a fingerprint information collection stage, and a fingerprint information detection stage. In the preparation stage, the light-sensing switch 32 of the light-sensing element 30 may be turned on, and the capacitor 34 may be charged. After the charging of the capacitor 34 is completed, the fingerprint information collection stage may be performed. In the fingerprint information collection stage, when a user presses a finger on the surface of the display panel, the light emitted by the backlight may be irradiated on the ridges and valleys of the finger and become reflected light; the reflected light may pass through a straight channel 22 and enter a corresponding light-sensing element 30, as shown in FIG. 3. The reflected light may then be received by the photodiode 33 of the light-sensing element 30, and form a photocurrent. The direction of the photocurrent may be from node J2 to node J1, causing the voltage potential at node J2 to change. In the fingerprint detection stage, the amount of the change in the voltage potential of J2 may be directly detected, and thus the magnitude of the photocurrent may be determined. At the same time, the light-sensing switch 32 of the light-sensing element 30 may be controlled to be turned on, such that there is a voltage potential difference between the two electrodes of the capacitor 34, and the capacitor 34 may thus be in a charged state. Further, by detecting the amount of charges stored in the capacitor 34, the magnitude of the photocurrent can then be determined.

In one embodiment, referring to FIG. 16, the photodiode 33 may include an N-type semiconductor portion 33a, a P-type semiconductor portion 33b, and a P electrode 33c. The active layer 32d of the light-sensing switch 32 may include an extension portion 32e, and the extension portion 32e may be multiplexed as the N-type semiconductor portion 33a. The P electrode 33c and the P-type semiconductor portion 33b may be electrically connected.

In one embodiment, the core component of the photodiode 33 may be a PN junction, and the N-type semiconductor portion 33a and the P-type semiconductor portion 33b may be in close contact to form the PN junction. At the same time, the active layer 32d of the light-sensing switch 32 may be designed to have an extra length (e.g., include an extension portion 32e) such that a portion of the active layer 32d may be overlapped with the gate 32c to function as a switch, and another portion of the active layer 32d (i.e., the extension portion 32e) may serve as the N-type semiconductor portion 33a of the photodiode 33. As such, it is not necessary to additionally increase the manufacturing process of the N-type semiconductor portion 33a, which is conducive to reducing the manufacturing process of the display panel and realizing the slim design of the display panel; moreover, when the light-sensing switch 32 is turned on, the voltage signal can be directly transmitted to the N-type semiconductor portion 33a via the active layer 32d of the light-sensing switch 32, and there is no need to provide a connection member between the light-sensing switch 32 and the photodiode 33, thereby further simplifying the manufacturing process of the display panel.

The P electrode 33c of the photodiode 33 may be used to transmit a voltage signal to the P-type semiconductor portion 33b of the PN junction, such that the two poles of the PN junction respectively receive corresponding voltage signals, thereby realizing the fingerprint recognition function. In actual applications, the voltage signal on the P electrode 33c can be a common voltage signal, that is, the P electrode 33c can be multiplexed as a common electrode, which is conducive to reducing the number of layers of the display panel, allowing a thin and light design to be easily achieved.

Figure 17:
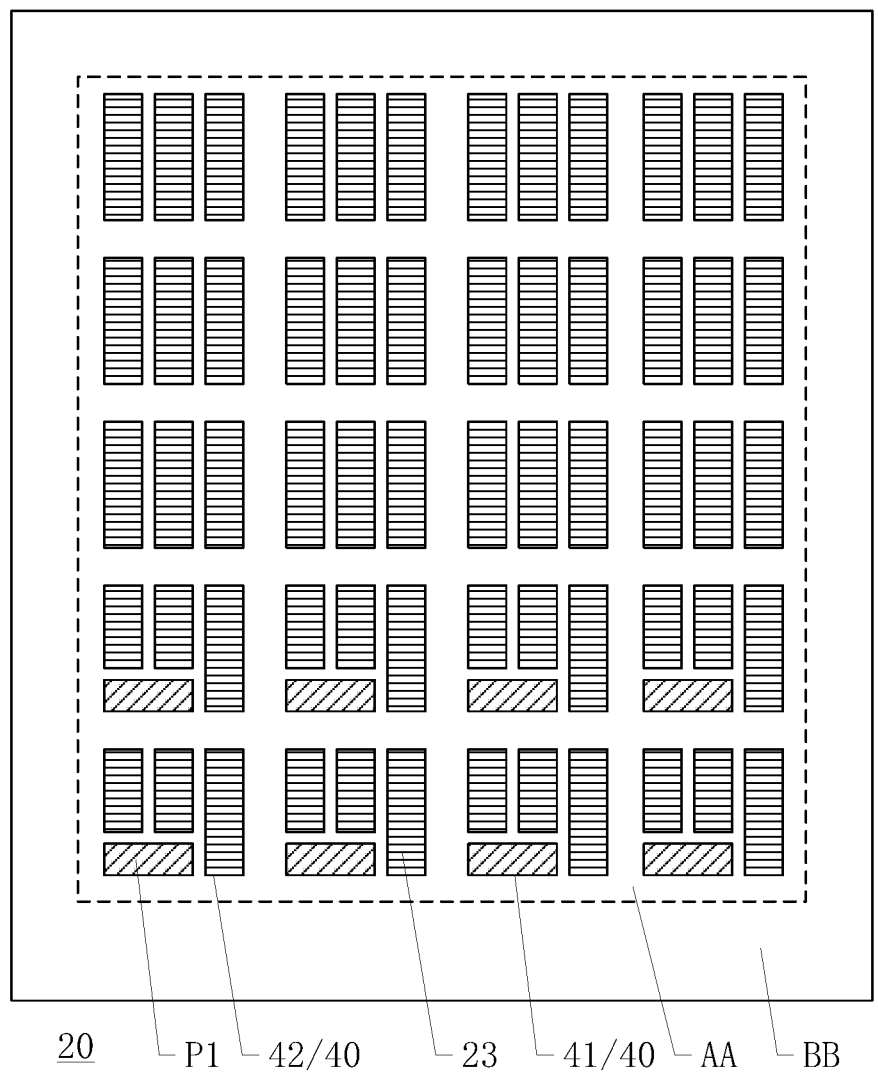
FIG. 17 illustrates a schematic plan view of an exemplary color film substrate according to some embodiments of the present disclosure.

In some embodiments, referring to FIG. 3, FIG. 14 and FIG. 17, the color film substrate 20 may further include a plurality of color resists 23 (e.g., the portion filled with horizontal lines in FIG. 17). The first light-shielding layer 40 may further include a plurality of fourth hollowed regions 42, and the plurality of color resists 23 may be located in the plurality of fourth hollowed regions 42.

In one embodiment, the array substrate 10 and the color film substrate 20 may be arranged in opposite to each other, that is, in a direction perpendicular to the plane of the display panel, the display region AA and the non-display region BB of the color film substrate 20 may correspond to the display region AA and the non-display region BB of the array substrate 10, respectively. In addition, the color film substrate 20 may include a plurality of color resists 23, and the light emitted by the pixels on the array substrate 10 may pass through the color resists 23, and thus visually display the colors corresponding to the color resists 23. As such, the display panel may be able to display the desired picture.

In one embodiment, the first light-shielding layer 40 may include a plurality of first hollowed regions 41 and a plurality of fourth hollowed regions 42, the plurality of color resists 23 may be located in the plurality of fourth hollowed regions 42, and in a direction perpendicular to the plane of the first substrate 21, the plurality of first hollowed regions 41 may, as a part of the plurality of straight channels 22, have orthogonal projections overlapping with the orthogonal projections of the plurality of light-sensing elements 30, and may be filled with the organic material of the first flat layer P1 (e.g., the portion filled with slash lines in FIG. 17).

It should be noted that FIG. 17 only illustrates an example in which three color resists 23 in FIG. 17 correspond to one pixel (that is, one pixel includes three sub-pixels). In addition, for the plurality of first hollowed regions 41 and the plurality of fourth hollowed regions 42, the numbers, the shapes, and the positions on the first light-shielding layer 40 may be arranged in various ways. For example, the plurality of first hollowed regions 41 in FIG. 17 may correspond to all or part of the pixels. As such, in order to ensure the recognition accuracy of fingerprint information corresponding to the plurality of light-sensing elements 30, the first hollowed region 41 may not be set too small. For example, setting each first hollowed region 41 to occupy an area of at least two fourth hollowed regions 42 may be able to make the size of the light-sensing element 30 reasonable, and may also be conducive to increasing the reflected light entering the light-sensing element 30, thereby improving the recognition accuracy of the fingerprint information corresponding to the light-sensing element 30. Of course, the plurality of first hollowed regions 41 may all be concentrated in one area, that is, only the area that contains the plurality of first hollowed regions 41 has the function of optical fingerprint recognition. The present disclosure is not limited to the above embodiments.

Figure 18:
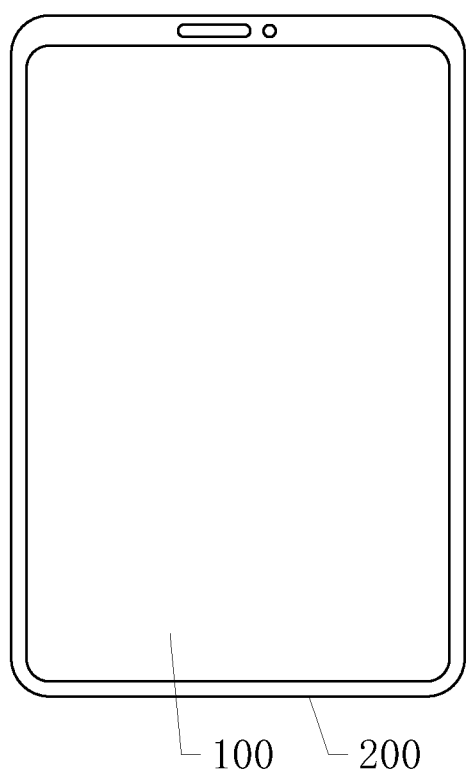
FIG. 18 illustrates a schematic structural diagram of an exemplary display device according to some embodiments of the present disclosure.

Further, the present disclosure also provides a display device. The display device may include a display panel according to various embodiments of the present disclosure. FIG. 18 illustrates a schematic structural diagram of an exemplary display device according to some embodiments of the present disclosure.

Referring to FIG. 18, in one embodiment, the display device 200 may include a display panel 100 according to various embodiments of the present disclosure. The display device 200 shown in FIG. 18 is described as a mobile phone to provide an example for illustration. It should be understood that the display device 200 according to various embodiments of the present disclosure may be a display device having a display function, such as a tablet computer, a television, an in-vehicle display, etc., and the present disclosure is not limited to the above embodiments. The display device provided by the embodiments of the present disclosure may demonstrate the beneficial effects of the display panel according to various embodiments of the present disclosure. For the details of the beneficial effects, reference may be made to the detailed description of the display panel in the foregoing embodiments, which are not described herein again.

Compared to existing display panels and display devices, the disclosed display panel and display device may be able to achieve at least the following beneficial effects.

The disclosed display panel has an optical fingerprint recognition function by providing a plurality of light-sensing elements on the array substrate; at the same time, at least two light-shielding layers with each containing a plurality of hollowed regions are disposed on the color film substrate, and the orthogonal projections of a hollowed region of the plurality of hollowed regions and a light-sensing element of the plurality of light-sensing elements overlap with each other, which is equivalent to providing a straight channel for the fingerprint information entering the light-sensing element. As such, a plurality of straight channels is formed, and each straight channel is able to block the light noise from entering the corresponding light-sensing element, thereby preventing the influence of the light noise on the fingerprint information; in addition, the overlapping portion between the fingerprint information recognition regions can be reduced by the straight channels, which may facilitate the imaging of fingerprint information, thereby efficiently improving the recognition accuracy of fingerprint information. The first planner layer is located between the first light-shielding layer and the at least one second light-shielding layer, and the thickness of the film layer can be made large, which is conducive to increasing the height of the straight channels, thereby further improving the accuracy of fingerprint recognition. Moreover, the structure of the light-shielding layers is simple and easy to make, and by controlling the number of the at least one second light-shielding layer, the structure of the light-shielding layers can meet various accuracy requirements of optical fingerprint recognition, and thus may have an expanded application range.

Of course, any of the products embodying the present invention may not necessarily require to meet all of the technical effects described above at the same time.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A display panel, comprising:
   an array substrate; and
   a color film substrate disposed opposite to the array substrate, wherein:
   the array substrate includes a plurality of light-sensing elements,
   the color film substrate includes a first substrate, a first light-shielding layer, and at least one second light-shielding layer,
   the first light-shielding layer is located on a side of the first substrate adjacent to the array substrate, and includes a plurality of first hollowed regions,
   the at least one second light-shielding layer is located on a side of the first light-shielding layer adjacent to the array substrate, and includes a plurality of second hollowed regions,
   in a direction perpendicular to a plane of the first substrate, orthogonal projections of a first hollowed region of the plurality of first hollowed regions, a second hollowed region of the plurality of second hollowed regions, and a light-sensing element of the plurality of light-sensing elements overlap with each other, and
   a first flat layer is disposed between the first light-shielding layer and the at least one second light-shielding layer.

2. The display panel according to claim 1, further including:
   a plurality of first lenses, wherein:
   the plurality of first lenses is located in the plurality of first hollowed regions and/or the plurality of second hollowed regions; and
   a curved surface of each first lens of the plurality of first lenses is arranged to face toward the array substrate.

3. The display panel according to claim 2, wherein:
   in a direction parallel to the plane of the first substrate, a cross section of each first hollowed region of the plurality of first hollowed regions has a circular shape; and
   a curvature radius of the curved surface of each first lens of the plurality of first lenses is R, where $R \geq (4d^2+D^2)/(8d)$, d is a maximum thickness of the first lens, and D is a diameter of each first hollowed region of the plurality of first hollowed regions.

4. The display panel according to claim 1, further including:
   a second flat layer, disposed on a side of the at least one second light-shielding layer adjacent to the array substrate.

5. The display panel according to claim 4, further including:
   a plurality of second lenses, wherein:
   the plurality of second lenses is located on a side of the second flat layer adjacent to the array substrate, and a curved surface of each second lens of the plurality of second lenses is arranged to face toward the array substrate, and
   in the direction perpendicular to the plane of the first substrate, orthogonal projections of a second lens of the plurality of second lenses, a second hollowed region of the plurality of second hollowed religions, and a light-sensing element of the plurality of light-sensing elements overlap with each other.

6. The display panel according to claim 5, further including:
   a plurality of support pillars, wherein the plurality of support pillars is located between the array substrate and the color film substrate.

7. The display panel according to claim 6, wherein:
   the plurality of second lenses and the plurality of support pillars are disposed in a same layer using a same material.

8. The display panel according to claim 6, wherein:
   a maximum thickness of the plurality of second lenses is smaller than or equal to a height of the plurality of support pillars.

9. The display panel according to claim 1, wherein:
   the array substrate further includes a third light-shielding layer and a third flat layer; and
   the third light-shielding layer is located on a side of the third flat layer adjacent to the color film substrate, and includes a plurality of third hollowed regions; and
   in the direction perpendicular to the plane of the first substrate, orthogonal projections of a third hollowed region of the plurality of third hollowed regions and a light-sensing element of the plurality of light-sensing elements overlap with each other.

10. The display panel according to claim 9, wherein:
the array substrate includes a display region, and a non-display region surrounding the display region; and
the third light-shielding layer further includes at least one ground line, wherein the at least one ground line is located in the non-display region.

11. The display panel according to claim 1, wherein:
each light-sensing element of the plurality of light-sensing elements includes a light-sensing switch and a photosensitive diode; and
a first electrode of the light-sensing switch is electrically connected to the photosensitive diode.

12. The display panel according to claim 11, wherein:
the photosensitive diode includes an N-type semiconductor portion, a P-type semiconductor portion, and a P electrode;
an active layer of the light-sensing switch includes an extension portion, wherein the extension portion is multiplexed as the N-type semiconductor portion; and
the P electrode is electrically connected to the P-type semiconductor portion.

13. The display panel according to claim 11, wherein:
each light-sensing element of the plurality of light-sensing elements further includes a capacitor, wherein the capacitor and the photosensitive diode are connected in parallel.

14. The display panel according to claim 1, wherein:
the color film substrate further includes a plurality of color resists; and
the first light-shielding layer further includes a plurality of fourth hollowed regions, wherein:
the plurality of color resists is located in the plurality of fourth hollowed regions.

15. A display device, comprising a display panel, wherein the display panel includes:
an array substrate; and
a color film substrate disposed opposite to the array substrate, wherein:
the array substrate includes a plurality of light-sensing elements,
the color film substrate includes a first substrate, a first light-shielding layer, and at least one second light-shielding layer,
the first light-shielding layer is located on a side of the first substrate adjacent to the array substrate, and includes a plurality of first hollowed regions,
the at least one second light-shielding layer is located on a side of the first light-shielding layer adjacent to the array substrate, and includes a plurality of second hollowed regions,
in a direction perpendicular to a plane of the first substrate, orthogonal projections of a first hollowed region of the plurality of first hollowed regions, a second hollowed region of the plurality of second hollowed regions, and a light-sensing element of the plurality of light-sensing elements overlap with each other, and
a first flat layer is disposed between the first light-shielding layer and the at least one second light-shielding layer.

16. The display device according to claim 15, wherein:
the display panel further includes a plurality of first lenses, wherein:
the plurality of first lenses is located in the plurality of first hollowed regions and/or the plurality of second hollowed regions; and
a curved surface of each first lens of the plurality of first lenses is arranged to face toward the array substrate.

17. The display device according to claim 16, wherein:
in a direction parallel to the plane of the first substrate, a cross section of each first hollowed region of the plurality of first hollowed regions has a circular shape; and
a curvature radius of the curved surface of each first lens of the plurality of first lenses is R, where $R \geq (4d^2+D^2)/(8d)$, d is a maximum thickness of the first lens, and D is a diameter of each first hollowed region of the plurality of first hollowed regions.

18. The display device according to claim 15, wherein:
the display panel further includes a second flat layer disposed on a side of the at least one second light-shielding layer adjacent to the array substrate.

19. The display device according to claim 18, wherein:
the display panel further includes a plurality of second lenses, wherein:
the plurality of second lenses is located on a side of the second flat layer adjacent to the array substrate, and a curved surface of each second lens of the plurality of second lenses is arranged to face toward the array substrate, and
in the direction perpendicular to the plane of the first substrate, orthogonal projections of a second lens of the plurality of second lenses, a second hollowed region of the plurality of second hollowed religions, and a light-sensing element of the plurality of light-sensing elements overlap with each other.

20. The display device according to claim 19, wherein:
the display panel further includes a plurality of support pillars, wherein:
the plurality of support pillars is located between the array substrate and the color film substrate,
the plurality of second lenses and the plurality of support pillars are disposed in a same layer using a same material, and
a maximum thickness of the plurality of second lenses is smaller than or equal to a height of the plurality of support pillars.

* * * * *